(12) United States Patent
Doan et al.

(10) Patent No.: US 7,323,230 B2
(45) Date of Patent: Jan. 29, 2008

(54) COATING FOR ALUMINUM COMPONENT

(75) Inventors: Trung T. Doan, Los Gatos, CA (US); Kenny King-Tai Ngan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/910,096

(22) Filed: Aug. 2, 2004

(65) Prior Publication Data

US 2006/0024517 A1    Feb. 2, 2006

(51) Int. Cl.
  *H05H 1/24* (2006.01)
  *H05H 1/30* (2006.01)
  *C23C 14/00* (2006.01)

(52) U.S. Cl. .................... 427/569; 427/575; 427/576; 427/252; 427/255.26; 427/383.3

(58) Field of Classification Search ............... 428/469; 205/175
  See application file for complete search history.

(56) References Cited

U.S. PATENT DOCUMENTS

| | | | |
|---|---|---|---|
| 3,616,310 A | 10/1971 | Dorsey, Jr. | |
| 4,606,796 A | 8/1986 | Hanazima et al. | |
| 4,862,799 A | 9/1989 | Hycner et al. | |
| 5,104,514 A | 4/1992 | Quartarone | |
| 5,141,603 A * | 8/1992 | Dickey et al. | 205/175 |
| 5,290,424 A | 3/1994 | Mozelewski et al. | |
| 5,314,601 A | 5/1994 | Hardee et al. | |
| 5,756,222 A | 5/1998 | Bercaw et al. | |
| 5,856,236 A | 1/1999 | Lai et al. | |
| 5,858,464 A | 1/1999 | Littau et al. | |
| 6,117,772 A | 9/2000 | Murzin et al. | |
| 6,355,554 B1 | 3/2002 | Choi et al. | |
| 6,368,880 B2 | 4/2002 | Singhvi et al. | |
| 6,458,683 B1 | 10/2002 | Lee | |
| 6,458,684 B1 | 10/2002 | Guo et al. | |
| 6,471,879 B2 | 10/2002 | Hanson et al. | |
| 6,537,905 B1 | 3/2003 | Chen et al. | |
| 6,565,984 B1 | 5/2003 | Wu et al. | |
| 6,592,707 B2 | 7/2003 | Shih et al. | |
| 6,649,031 B1 | 11/2003 | Iqbal et al. | |
| 6,649,039 B2 | 11/2003 | Hsu et al. | |
| 6,659,331 B2 | 12/2003 | Thach et al. | |
| 6,672,917 B2 | 1/2004 | Matsuda et al. | |
| 6,713,188 B2 | 3/2004 | Wu et al. | |
| 2003/0150530 A1 | 8/2003 | Lin et al. | |
| 2003/0205479 A1 | 11/2003 | Lin et al. | |

* cited by examiner

*Primary Examiner*—Jennifer C. McNeil
*Assistant Examiner*—Timothy M. Speer
(74) *Attorney, Agent, or Firm*—Janah & Associates

(57) ABSTRACT

A coated aluminum component for a substrate processing chamber comprises an aluminum component having a surface; a first aluminum oxide layer formed on the surface of the aluminum component, the aluminum oxide layer having a surface comprising penetrating surface features; and a second aluminum oxide layer on the first aluminum oxide layer, the second aluminum oxide layer substantially completely filling the penetrating surface features of the first aluminum oxide layer. A method of forming the coated aluminum component is also described.

29 Claims, 3 Drawing Sheets

COATING FOR ALUMINUM COMPONENT

BACKGROUND

Figure 1:
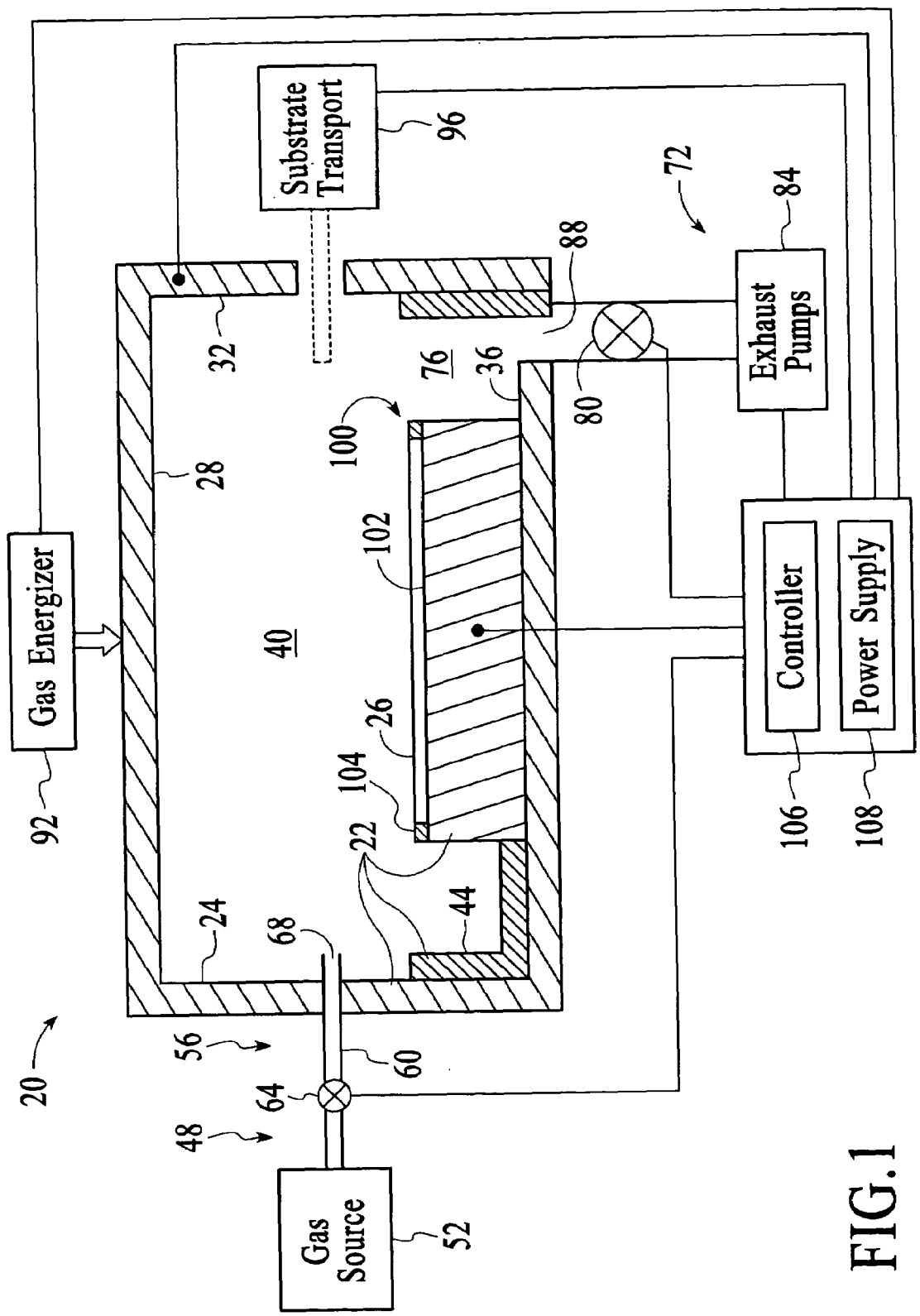

The present invention relates to aluminum components for a substrate processing chamber and methods of manufacturing the same.

In the processing of a substrate in a substrate processing chamber, as in the manufacture of integrated circuits and displays, the substrate is typically exposed to energized gases that are capable of, for example, etching or depositing material on the substrate. The energized gases can also be provided to clean surfaces of the chamber. However, the energized gases can often comprise corrosive halogen-containing gases and other energized species that can corrode components of the chamber, such as enclosure walls of the chamber. For example, chamber components made of aluminum can chemically react with energized halogen-containing gases to form $AlCl_3$ or $AlF_3$, thereby corroding the components. The corroded portions of the components can flake off and contaminate the substrate, which reduces the substrate yield. Thus, the corroded components must often be replaced or removed from the chamber and cleaned, resulting in undesirable chamber downtime.

The corrosion resistance of a chamber component can be improved by forming a coating of a corrosion resistant material over surfaces of the component that are susceptible to corrosion, such as surfaces that would otherwise be exposed to the energized gas. For example, a coating of aluminum oxide can be formed on surfaces of an aluminum component to form a coating that exhibits improved corrosion resistance. One method to form an aluminum oxide coating on an aluminum component is to anodize the aluminum component in an electrolytic cell. However, there are problems with such an anodized aluminum oxide coating. For example, anodized aluminum oxide coatings often contain surface features such as pores, cracks, indentures, and other penetrating surface features that limit the effectiveness of the coating to protect the underlying aluminum component. For example, surface features that penetrate deep into the protective coating allow corrosive gases relatively closer access to the underlying component material having the coating to corrode from within, which can lead to flaking off of the coating from the component.

One way to improve the performance of an anodized aluminum oxide coating is disclosed in U.S. Pat. No. 6,565,984 to Wu et al. and commonly assigned to Applied Materials Inc., issued May 20, 2003, which is herein incorporated by reference in its entirety. Wu et al. discloses an aluminum alloy article in which defects on the upper surface of an anodized aluminum oxide layer are controlled by controlling particulate inclusions at the surface of the aluminum article on which the anodized layer is formed. Particulate inclusions at the surface of the aluminum article are controlled by controlling the concentration of impurities in the comprising aluminum alloy. However, this approach is also deficient in some aspects. For example, an aluminum alloy with controlled impurity levels may be costly to produce. Additionally, this approach only accounts for anodized aluminum oxide surface defects caused by particulate inclusions at the surface of the underlying aluminum article. There may be other causes for defects on the surface of the anodized aluminum oxide layer. For example, the anodized aluminum oxide layer may inherently have a porosity that is independent of particulate inclusions on the surface of the aluminum article. Additionally, there may be cracks and other surface features caused by inherent imperfections in the anodization process.

Thus, there is a need for aluminum components that exhibit improved corrosion resistance to energized gases. There is also a need for aluminum components having an aluminum oxide coating that exhibits improved corrosion resistance and is less susceptible to flaking off the aluminum component.

SUMMARY

A method of coating a surface of an aluminum component comprises anodizing the surface of the aluminum component to form an anodized aluminum oxide layer, depositing an aluminum layer on the anodized aluminum oxide layer, heating the aluminum layer to re-flow the aluminum layer, and forming a second aluminum oxide layer from the aluminum layer. In one version, the aluminum layer is at least partially consumed by the formation of the second aluminum oxide layer, and in another version, the aluminum layer is substantially completely consumed by the formation of the second aluminum oxide layer. In one version, a portion of the method of coating the surface of the aluminum component can be used to coat an anodized surface of an aluminum component. Also, a method of fabricating an aluminum component comprises forming the aluminum component having a surface, then using the method of coating the surface of an aluminum component.

The coated aluminum component can be used in a substrate processing chamber and comprises an aluminum component having a surface, a first aluminum oxide layer formed on the surface of the aluminum component, and a second aluminum oxide layer on the first aluminum oxide layer. The first aluminum oxide layer has a surface comprising penetrating surface features, and the second aluminum oxide layer substantially completely fills the penetrating surface features of the first aluminum oxide layer. In one version, the ratio of the thickness of the first aluminum oxide layer to the thickness of the second aluminum oxide layer is from about 5:1 to about 9:1. Also, in one version, the first aluminum oxide layer is an anodized aluminum oxide layer.

DRAWINGS

Figure 2:
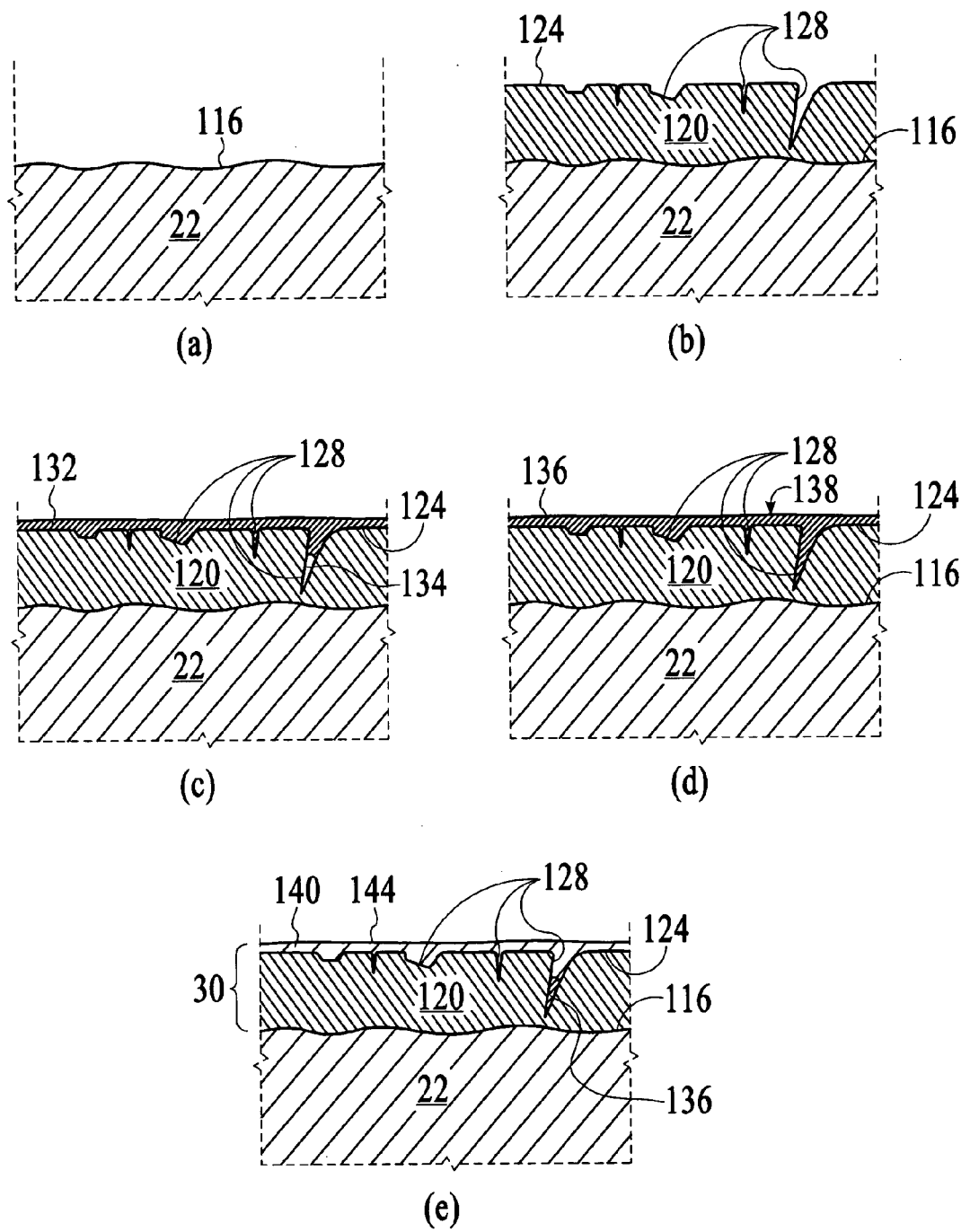
Figure 3:
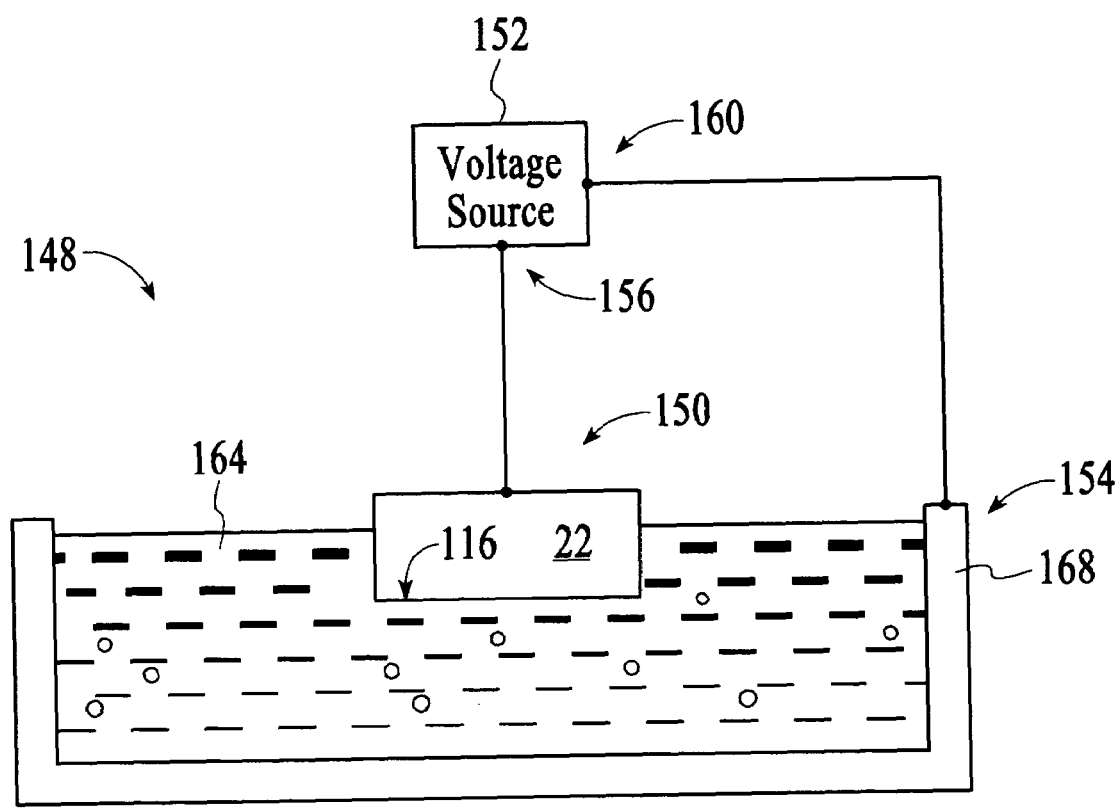

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 1 is a schematic view of a substrate processing chamber having an aluminum component with a coating according to the present invention, the chamber also being suitable for conducting steps of the method to fabricate the aluminum component having the coating;

FIGS. 2a-e are sectional views of stages in the method to form the aluminum component having the coating; and FIG. 3 is a schematic view of an anodizing apparatus suitable for conducting steps of the method to fabricate the aluminum component having the coating.

DESCRIPTION

A coated aluminum component can be used in a substrate processing chamber 20, an embodiment of which is shown in FIG. 1. The coating protects surfaces of the aluminum component 22 that are exposed to energized gases, plasmas, high temperatures, corrosive gases, and/or erosive sputtering species in a process zone 40 of the chamber 20. Generally, the substrate processing chamber 20 comprises enclosure walls 24, including a ceiling 28, sidewalls 32, and a bottom wall 36, that enclose the process zone 40. The chamber 20 may also comprise a liner 44 that lines at least a portion of the enclosure wall 24 about the process zone 40.

Process gas is introduced into the chamber 20 through a gas supply 48 that includes a process gas source 52 and a gas distributor 56. The gas distributor 56 may comprise one or more conduits 60 having one or more gas flow valves 64, and one or more gas inlets 68 around a periphery of a substrate support 100 having a substrate receiving surface 102 to receive a substrate 26. Alternatively, the gas distributor may comprise a showerhead gas distributor (not shown) which distributes the process gas to the process zone 40 from the ceiling 28. Spent process gas and etchant byproducts are exhausted from the chamber 20 through an exhaust 72 which may include a pumping channel 76 that receives spent process gas from the process zone 40, a throttle valve 80 to control the pressure of process gas in the chamber 20, and one or more exhaust pumps 84.

The process gas may be energized by a gas energizer 92 that couples energy to the process gas in the process zone 40 of the chamber 20. In one version, the gas energizer 92 comprises electrodes that are powered by a power supply to energize the process gas. The electrodes may include an electrode that is in a wall, such as a sidewall 32 or ceiling 28 of the chamber 20, which may be capacitively coupled to another electrode, such as an electrode in the support 100 below the substrate 26. Alternatively or additionally, the gas energizer 92 may comprise an antenna comprising one or more inductor coils about the chamber 20. In yet another version, the gas energizer 92 may comprise a microwave source and waveguide to activate the process gas by microwave energy in a remote zone (not shown) upstream from the chamber 20. To process the substrate 26, the process chamber 20 is evacuated and maintained at a predetermined sub-atmospheric pressure though an exhaust port 88 in the chamber 20. The substrate 26 is then provided on the support 100 by a substrate transport 96, such as for example, a robot arm and a lift pin system. The substrate support 100 may also comprise one or more rings 104 that at least partially surround a periphery of the substrate 26 to secure the substrate 26 on the support 100, or to otherwise aid in processing the substrate 26, for example by focusing energetic plasma species onto the substrate 26. The gas energizer 92 then energizes the gas to provide an energized gas in the process zone 40 to process the substrate 26 by coupling RF or microwave energy to the gas.

The aluminum component 22 having the coating 30 is illustrated at various stages of its fabrication in FIGS. 2a-e. The aluminum component 22 may be at least a portion of one or more of the enclosure wall 24, liner 44, substrate support 100, gas supply 48, gas energizer 92, gas exhaust 72, and substrate transport 96. Additionally, the aluminum component 22 may be another component not shown in FIG. 1.

The aluminum component 22 can be formed by shaping aluminum or an aluminum alloy into the shape required by the function of the component 22 in the processing chamber 20. For example, the aluminum component 22 can comprise a shape having planar portions, curved portions, ledges, flanges, holes, and other geometric arrangements. The component 22 can be formed by a number of processes, including forging, machining, molding, extruding, or a combination of these or other manufacturing processes. The aluminum or aluminum alloy of the component 22 is selected according to the manufacturing and functional requirements of the component 22. For example, the shape and size of the component 22 can determine the desired material properties of the aluminum or aluminum alloy.

In one version, the aluminum or aluminum alloy of the component 22 is an aluminum alloy referred to as LP™ aluminum alloy, which is an aluminum alloy described in U.S. Patent Application Publication 2003/0150530, to Lin et al., assigned to Applied Materials, Inc. of Santa Clara, Calif. LP™ is a trademark of Applied Materials Inc. LP™ aluminum alloy can be advantageous because it results in a higher quality anodized aluminum coating. LP™ aluminum alloy should have the following composition by weight %: a magnesium concentration ranging from about 3.5% to about 4.0%, a silicon concentration ranging from 0% to about 0.03%, an iron concentration ranging from 0% to about 0.03%, a copper concentration ranging from about 0.02% to about 0.07%, a manganese concentration ranging from about 0.005% to about 0.015%, a zinc concentration ranging from about 0.08% to about 0.16%, a chromium concentration ranging from about 0.02% to about 0.07%, and a titanium concentration ranging from 0% to about 0.01%, with other single impurities not exceeding about 0.03% each and other total impurities not exceeding about 0.1%. In addition, LP™ aluminum alloy is required to meet a particular specification with respect to particulates formed from mobile impurities. Of the particulate agglomerations of impurity compounds, at least 95% of all particles must be less than 5 μm in size. Five (5) % of the particles may range from 5 μm to 20 μm in size. Finally, no more than 0.1% of the particles may be larger than 20 μm, with no particles being larger than 40 μm.

In another version, the aluminum or aluminum alloy of the component 22 can be an aluminum-magnesium-silicon alloy, such as for example, 6061 aluminum alloy, which can be advantageous because it is a common and readily available material. In still other versions, the aluminum or aluminum alloy of the component 22 can be an aluminum-magnesium alloy, such as a 5000 series (5xxx) aluminum alloy (for example 5005, 5050, 5052, 5083, 5086, 5144, 5144, 5357, 5447, 5454, 5456, or 5457 aluminum alloy).

The surface 116 of the component 22 that receives the coating 30 may be prepared to receive the coating 30. Preparation of the surface prior to forming the coating 30 may contribute to the speed and ease of fabrication and the quality of the final coating 30.

In one version, preparation of the surface 116 of the component 22 includes performing a grit blasting process that propels grit particles at the surface 116. The grit blasting process forms a suitable surface roughness and other characteristics of the surface 116 of the aluminum component 22. For example, grit blasting may erode away excessively sharp edges and corners of features of the component surface 116, thereby producing a surface 116 that does not present potentially stress-inducing features to overlying layers. The grit blasting process can also texture portions of the component surface 116 to improve adhesion of materials to the surface 116. For example, deposited material may adhere better to a surface with a controlled texture in comparison to a completely smooth surface.

In the grit blasting process, a stream of hard grit particles is propelled toward the surface 116 of the component 22 by gas that is pressurized to a pressure sufficiently high to cause the grit particles to erode and remove material from the surface 116. For example, a suitable pressure may be from about 20 psi to about 110 psi. The grit particles desirably comprise a material having a hardness that is higher than that of the surface 116. For example, the grit particles can comprise aluminum oxide, garnet, silicon oxide, silicon carbide, glass, silica, hard plastic or mixtures thereof. The grit particle size can also be selected to influence the size of features created by the grit blasting process on the surface 116. For example, the grit particles can have a mesh size of from about 100 to about 200. The angle of incidence of the grit particles relative to the component surface 116 and the standoff distance traveled by the grit particles from their source to the component 22 can also be selected to provide the desired roughness of the surface 116. For example, the angle of incidence of the grit particles relative to the component surface 116 may be about 30° to about 60°, and the standoff distance may be from about 7 cm to about 32 cm. In one version, the surface 116 of the component 22 is roughened to have a roughness average of, for example, from about 100 microinches to about 200 microinches.

Preparation of the surface 116 of the component 22 may also include cleaning of the surface 116 of the component 22 to remove impurities and loose particles. The cleaning process can also remove chemicals or materials that may remain from the fabrication of the component 22, such as oils or coolant from a forging or machining process, or sand or other materials from a molding process. The cleaning process may also chemically polish the surface 116 of the component 22. For example, the cleaning process can remove an external layer of material from the component 22. This may remove undesirable oxides and other materials that may have formed on the surface of the component 22. In one version, the surface 116 of the component 22 is immersed in a solution comprising an acidic solution, an organic solvent, an alkaline solution, water, de-ionized water, or mixtures thereof. For example, the acidic solution may comprise phosphoric acid, nitric acid, sulfuric acid or mixtures thereof. The organic solvent may comprise acetone, isopropyl alcohol, or mixtures thereof. The alkaline solution may comprise sodium hydroxide, potassium hydroxide, or mixtures thereof. Additionally, the surface may be immersed in several different solutions comprising different compositions and concentrations.

For example, in one version, the surface 116 of the component 22 may be cleaned by (i) immersing the surface 116 in a solution comprising an organic solvent, (ii) rinsing the surface 116 in water, (iii) immersing the surface 116 in a solution comprising an acid, and (iv) rinsing the surface 116 in de-ionized water. In step (iii), the solution may comprise, for example, about 5% to about 50% by weight sulfuric acid at a temperature of about 15° C. to about 90° C., and the surface 116 may be immersed for about 1 minute to about 30 minutes. In another example, the surface 116 of the component 22 may be cleaned by (i) immersing the surface 116 in a solution comprising nitric acid, (ii) rinsing the surface 116 in de-ionized water, (iii) immersing the surface 116 in a solution comprising sodium hydroxide, (iv) rinsing the surface 116 in de-ionized water, (v) immersing the surface 116 in a solution comprising acetone, and (vi) immersing the surface 116 in a solution comprising isopropyl alcohol. Also, other cleaning methods such as ultrasonication can be used.

After the surface 116 of the aluminum component 22 is prepared, the prepared surface 116 is anodized to create an anodized aluminum oxide layer 120, as illustrated in FIG. 2b. In one version of the anodizing process, the component 22 serves as an anode 150 in an electrolytic cell 148, as shown for example in FIG. 3. The electrolytic cell 148 comprises a tank 168 holding an anodizing solution 164, a voltage source 152, and the component 22. The component 22 is connected to a positive terminal 156 of the voltage source 152, and the tank 168 serves as the cathode 154, connected to a negative terminal 160 of the voltage source 152. The surface 116 of the component 22 is immersed in the anodizing solution 164 comprising, for example, an aqueous electrolyte having ions containing oxygen. Application of a bias voltage to the cathode 154 and anode 150 from the voltage source 152 builds up a positive charge on the surface 116 of the component 22, attracting negatively charged electrolyte species in the solution to the surface 116. The oxygen in the negatively charged species combines with the aluminum of the surface 116 of the component to form an aluminum oxide layer 120.

The anodizing conditions, such as the concentration and composition of the anodizing solution 164, the voltage and current supplied by the voltage source 152, and the temperature at which the process is conducted may be selected to provide an anodized aluminum oxide layer 120 having desired thickness and structural properties. A suitable anodizing solution 164 can comprise, for example, sulfuric acid, chromic acid, oxalic acid, phosphoric acid, water or mixtures thereof. Other suitable anodizing conditions, such as different anodizing solution compositions and other electrolytes can also be used. For example, in one version, the aluminum component 22 is anodized in an anodizing solution 164 comprising 15% by weight of sulfuric acid, 1% by weight of chromic acid, and water. The aluminum component 22 is anodized for about 1 minute to about 30 minutes at a temperature of about 15° C. to about 40° C. The voltage applied between the cathode 154 and anode 150 is about 10 V to about 100 V, and the current is limited to about 0.5 amps to about 5 amps.

The surface 124 of the anodized aluminum oxide layer 120 generally has surface features 128 such as imperfections, cracks, fissures, pores, and other deviations from planarity. These surface features 128 are commonly found on surfaces of anodized aluminum oxide layers. The surface features 128 are both inherent to layers created by the anodizing process and are also caused by other sources such as impurities in the underlying aluminum component 22 and on its surface 116. Aspects of the surface features 128 are undesirable, however, in regards to the protection that the anodized aluminum oxide layer 120 is capable of providing to the underlying aluminum component 22. For example, surface features 128 that extend into the anodized aluminum oxide layer 120 allow eroding agents, such as gases and plasmas present in the process chamber 20 during processing of substrates 26, access to the interior of the aluminum oxide layer 120, thus reducing the effective thickness of the layer 120 that is protecting the underlying aluminum component 22. To reduce or remove the undesirable effect of the surface features 128, a second, flatter, aluminum oxide layer is formed on the anodized aluminum oxide layer 120 to fill and thus remove the surface features 128.

To form this second aluminum oxide layer, an aluminum layer 132 is first deposited on the anodized aluminum oxide layer 120 using a chemical vapor deposition (CVD) process. The exemplary substrate processing chamber 20 illustrated in FIG. 1 can be used to perform the CVD process, however, other types of chambers are also suitable. To process the component 22, the process chamber 20 is evacuated and maintained at a predetermined sub-atmospheric pressure. The component 22 is then provided on the support 100, for example, by the substrate transport 96. The gas supply 48 provides a process gas comprising an aluminum-containing gas to the chamber 20 to process the component 22. In one version, the gas energizer 92 couples RF or microwave energy to the process gas to energize the process gas. The component 22 may be held on the support 100 by applying a voltage to an electrode in the support 100 via a power supply 108. The substrate support 100 can also include a heater to provide heat to the component 22 during the CVD process. For example, an elevated component temperature may be suitable to thermally activate process gases present in the chamber 20. Effluent generated during the process is exhausted from the chamber 20 by the exhaust 72. The process is ended when an aluminum layer 132 of suitable thickness is deposited on the aluminum oxide layer 120.

In one version, the aluminum-containing gas comprises dimethylaluminum hydride (DMAH). In another version, the aluminum-containing gas may comprise dimethyl ethyl amine alane (DMEAA). The process gas may also include a carrier gas, such as argon, helium, nitrogen, or mixtures thereof. For example, in one exemplary embodiment of the process to deposit an aluminum layer 132, the component 22 is provided on the substrate support 100. The chamber 20 is evacuated to a process pressure of about 0.01 Torr to about 200 Torr and the component 22 is heated to a process temperature of about 5° C. to about 450° C. DMAH is then introduced into the chamber 20 at a flow rate of about 5 sccm to about 1,500 sccm. In one version, the process gas is energized in the chamber 20 by inductively or capacitively coupling microwave or RF energy to the process gas using the gas energizer 92, however in another version this is not done. The process deposits aluminum at a rate of about 100 Å/min to about 5,000 Å/min, and is allowed to run until the aluminum layer 132 of a desired thickness is deposited.

The chamber 20 can be controlled by a controller 106 that comprises program code having instruction sets to operate the chamber 20 to process substrates 26. For example, the controller 106 can comprise a substrate positioning instruction set to operate one or more of the substrate support 100 and robot arm and lift pins to position a substrate 26 in the chamber 20; a gas flow control instruction set to operate the gas supply 48 and flow control valves 64 to set a flow of gas to the chamber 20; a gas pressure control instruction set to operate the exhaust 72 and throttle valve 80 to maintain a pressure in the chamber 20; a gas energizer control instruction set to operate the gas energizer 92 to set a gas energizing power level; a temperature control instruction set to control temperatures in the chamber 20; and a process monitoring instruction set to monitor the process in the chamber 20. The substrate 26 processed by the substrate processing chamber 20, in the case of the CVD deposition of the aluminum layer 132, is the aluminum component 22.

In the method to form the coating 30, the CVD process is preferable in comparison to other processes to deposit the aluminum layer 132, for example such as physical vapor deposition (PVD). The CVD aluminum layer 132 is preferable to a PVD aluminum layer because the CVD process deposits a conformal aluminum layer 132, whereas the PVD process deposits an aluminum layer with a preferred directionality. For example, a PVD process may be less suited to fill deeply penetrating surface features 128 in the anodized aluminum oxide layer 120. Furthermore, a PVD process may be less suited to depositing a uniform layer on a highly shaped aluminum component 22. For example, a PVD process may not be suitable to deposit an aluminum layer 132 on the underside of flanges or lips, or on sidewalls of vertical features that may be present in the structure of the component 22. A CVD process, by comparison, is relatively more able to deposit aluminum into both deep surface features 128 and also vertical faces or the undersides of structures of the aluminum component 22.

After depositing the aluminum layer 132, the aluminum layer 132 is heated to re-flow the aluminum layer 132 to better fill the surface features 128 with aluminum, and to create a more planar surface of the aluminum layer 132. For example, even though the CVD process deposits a conformal layer, there may be voids 134 present between the aluminum layer 132 and the anodized aluminum oxide layer 120 before the aluminum layer is re-flowed, as illustrated in FIG. 2c. In the heating process, the component 22 having the aluminum layer 132 is heated to a temperature at which the deposited aluminum layer 132 begins to melt and then flow into deep surface features 128 and form a planar surface 138, as shown upon completion of the re-flow process in FIG. 2d. Upon completion of the re-flow process, substantially all the surface features are filled with aluminum, and in addition, there is a thickness of the aluminum layer 132 extending beyond the anodized aluminum oxide layer 120. For example, in one version of the re-flow process, the aluminum layer 132 is heated to from about 475° C. to about 600° C. for about 1 minute to about 30 minutes.

The re-flow process can occur in any environment in which the component 22 can be suitably heated. For example, in one version, the re-flow process occurs in the same chamber 20 in which the CVD aluminum layer 132 is deposited. The heater in the substrate support 100 can be used to heat the aluminum layer 132 to a suitable temperature to re-flow the aluminum. Alternatively, the re-flow process can be completed in a separate apparatus, such as a different substrate processing chamber, for instance a rapid thermal processing (RTP) chamber having halogen lamps to supply infrared heat energy, or in an a furnace heated by some type of fuel. The aluminum layer 132 can also be heated by other methods, such as by directing a laser beam onto the aluminum layer 132.

To complete the creation of the coating 30, the aluminum layer 132 is oxidized to create a second aluminum oxide layer 140 which substantially fills the surface features 128 of the anodized aluminum oxide layer 120. The aluminum layer 132 is oxidized by exposing it to an oxygen-containing gas. In one version of the oxidation process, the aluminum layer 132 can be heated, the oxygen-containing gas can be energized, or both, to promote oxidation of the aluminum layer 132. The oxidation of the aluminum layer 132 can occur in any apparatus suitable to expose the aluminum layer 132 to oxygen-containing gases or energized oxygen containing gases. The oxygen-containing gas can comprise, for example, oxygen, steam ($H_2O$) or mixtures thereof. In one version, the aluminum layer 132 can be oxidized in a similar chamber 20 in which the aluminum layer 132 is deposited. In one embodiment of this version, the CVD deposition, the re-flow, and the oxidation of the aluminum layer 132 can all occur in the same chamber 20. The advantage of this embodiment is that it shortens the processing time in comparison to embodiments in which separate chambers or apparatuses are used to complete these steps of the method to form the coating 30. In an exemplary embodiment, the aluminum layer 132 is oxidized in a chamber 20 similar to the one illustrated in FIG. 1, by heating the component 22 to from about 500° C. to about 625° C. in the presence of an oxygen-containing gas for about 0.5 hours to about 10 hours. In addition, the complete array of methodology discussed in regards to heating the aluminum layer 132 during the re-flow process, including the use of laser beams, can be used to heat the component 22 during the oxidation process. Furthermore, the re-flow process and the oxidation process can be intimately related, with the oxidation process potentially at least partially occurring simultaneously to the re-flow process.

Alternatively, the aluminum layer 132 can be converted to a second aluminum oxide layer 140 by anodizing the aluminum layer 132, performed as described above in the method to form the anodized aluminum oxide layer 120.

Since the aluminum deposited by the CVD process is relatively more pure than a typical aluminum or aluminum alloy of which the aluminum component 22 is comprised, the second aluminum oxide layer 140 created by anodization does not suffer from the same degree of surface features that the first anodized aluminum oxide layer 120 does. Thus, a coating comprising a first anodized aluminum oxide layer 120, and a second anodized aluminum oxide layer 140 created from an aluminum layer 132 deposited by CVD is more robust than a single anodized aluminum oxide layer 120, or even multiple layers of anodized aluminum oxide created only using the aluminum of the underlying aluminum component 22.

The overall thickness of the coating 30 is selected to maximize the protection of the coating 30 while minimizing undesirable aspects, such as the length and cost of processing the coating 30, and the tendency for excessively thick coatings 30 to delaminate from the underlying aluminum component 22. The overall coating thickness is comprised of the thickness of the anodized first aluminum oxide layer 120 and the thickness of the second aluminum oxide layer 140 which extends beyond the anodized first aluminum oxide layer 120. The thickness of the anodized first aluminum oxide layer 120 is generally selected to be a relatively large percentage of the overall thickness because the anodization process which forms the anodized first aluminum oxide layer 120 is generally faster than the CVD process which leads to the formation of the second aluminum oxide layer 140. For example, anodization typically creates an aluminum oxide layer 120 at a rate of from about 1,000 Å/min to about 25 µm/min, whereas a CVD process typically forms an aluminum layer 132 at a rate of from about 100 Å/min to about 5,000 Å/min, which does not include the time necessary to oxidize the aluminum layer 132 to form the second aluminum oxide layer 140. Thus, to reduce processing time for the overall coating 30, in one version, the ratio of the thickness of the first anodized aluminum oxide layer 120 to the thickness of the second aluminum oxide layer 140 is from about 5:1 to about 9:1. The second aluminum oxide layer 140 should be thick enough, however, to have resulted from an aluminum layer 132 that substantially completely fills all the surface features 128 of the anodized first aluminum oxide layer 120. For example, in one version, the first aluminum oxide layer 120 has a thickness of from about 5 µm to about 100 µm and the second aluminum oxide layer 140 has a thickness of from about 0.5 µm to about 20 µm.

Although exemplary embodiments of the present invention are shown and described, those of ordinary skill in the art may devise other embodiments which incorporate the present invention, and which are also within the scope of the present invention. For example, the aluminum layer 132 may be replaced with a layer of another metal, which is subsequently oxidized, without deviating from the scope of the present invention. Also, the underlying structure may form portions of chamber components 22 other than those specifically mentioned, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of coating a surface of an aluminum component, the method comprising:
    (a) anodizing the surface of the aluminum component to form an anodized aluminum oxide layer;
    (b) depositing an aluminum layer on the anodized aluminum oxide layer by a chemical vapor deposition process comprising:
        (i) placing the component in a process zone of a substrate processing chamber; and
        (ii) providing an energized process gas comprising an aluminum-containing gas in the process zone to deposit an aluminum layer on the anodized aluminum oxide layer;
    (c) heating the aluminum layer to re-flow the aluminum layer; and
    (d) forming a second aluminum oxide layer from the aluminum layer.

2. A method according to claim 1 wherein the aluminum layer is at least partially consumed by the formation of the second aluminum oxide layer.

3. A method according to claim 2 wherein the aluminum layer is substantially completely consumed by the formation of the second aluminum oxide layer.

4. A method according to claim 1 comprising cleaning the surface of the aluminum component prior to (a).

5. A method according to claim 4 wherein cleaning the surface of the aluminum component comprises dipping the surface of the aluminum component into a cleaning solution.

6. A method according to claim 5 wherein the cleaning solution comprises an organic solvent, an alkaline solution, an acidic solution, water, de-ionized water, or mixtures thereof.

7. A method according to claim 5 wherein the surface of the aluminum component is dipped into a plurality of different cleaning solutions.

8. A method according to claim 4 comprising grit blasting the surface of the aluminum component prior to cleaning the surface of the aluminum component.

9. A method according to claim 1 wherein (d) comprises exposing the aluminum layer to an oxygen-containing gas.

10. A method according to claim 9 wherein the oxygen-containing gas is energized.

11. A method according to claim 1 wherein (b) (ii) comprises energizing the process gas with RF energy.

12. A method according to claim 1 wherein the aluminum-containing gas comprises dimethylaluminum hydride, dimethyl ethyl amine alane, argon, or mixtures thereof.

13. A method according to claim 1 wherein (a) comprises:
    (i) dipping the surface of the aluminum component in an acidic solution; and
    (ii) applying a positive voltage to the aluminum component.

14. A method according to claim 13 wherein the acidic solution comprises sulfuric acid, chromic acid, oxalic acid, phosphoric acid, water or mixtures thereof.

15. A method according to claim 1 comprising energizing the process gas using microwave energy.

16. A method of coating an anodized surface of an aluminum component, the method comprising:
    (a) depositing an aluminum layer on the anodized surface of the aluminum component by a chemical vapor deposition process comprising:
        (i) placing the component in a process zone of a substrate processing chamber; and
        (ii) providing an energized process gas comprising an aluminum-containing gas in the process zone to deposit an aluminum layer on the anodized aluminum oxide layer;

(b) heating the aluminum layer to re-flow the aluminum layer; and (c) forming an aluminum oxide layer from the aluminum layer.

17. A method according to claim 16 wherein the aluminum layer is at least partially consumed by the formation of the aluminum oxide layer.

18. A method according to claim 16 wherein (c) comprises exposing the aluminum layer to an oxygen-containing gas.

19. A method according to claim 16 wherein (a) comprises:
   (i) placing the anodized surface of the aluminum component in a process zone; and
   (ii) introducing a process gas comprising an aluminum-containing gas to the process zone.

20. A method according to claim 19 wherein the aluminum-containing gas comprises dimethylaluminum hydride, dimethyl ethyl amine alane, argon, or mixtures thereof.

21. A method of fabricating an aluminum component, the method comprising:
   (a) forming the aluminum component having a surface;
   (b) anodizing the cleaned surface of the aluminum component to form an anodized aluminum oxide layer;
   (c) depositing an aluminum layer on the anodized aluminum oxide layer by a chemical vapor deposition process comprising:
      (i) placing the component in a process zone of a substrate processing chamber; and
      (ii) providing an energized process gas comprising an aluminum-containing gas in the process zone to deposit an aluminum layer on the anodized aluminum oxide layer;
   (d) heating the aluminum layer to re-flow the aluminum layer; and
   (e) forming a second aluminum oxide layer from the aluminum layer.

22. A method according to claim 21 wherein the aluminum layer is at least partially consumed by the formation of the second aluminum oxide layer.

23. A method according to claim 21 comprising cleaning the surface of the aluminum component after forming the aluminum component and prior to anodizing the surface of the aluminum component.

24. A method according to claim 23 wherein cleaning the surface of the aluminum component comprises dipping the surface of the aluminum component into a cleaning solution comprising an organic solvent, an alkaline solution, an acidic solution, water, de-ionized water, or mixtures thereof.

25. A method according to claim 21 wherein (e) comprises exposing the aluminum layer to an oxygen-containing gas.

26. A method according to claim 21 wherein (c) comprises:
   (i) placing a surface of the anodized aluminum oxide layer in a process zone; and
   (ii) introducing a process gas comprising an aluminum-containing gas to the process zone.

27. A method according to claim 25 wherein the aluminum-containing gas comprises dimethylaluminum hydride, dimethyl ethyl amine alane, argon, or mixtures thereof.

28. A method according to claim 21 wherein (b) comprises:
   (i) dipping the surface of the aluminum component in an acidic solution; and
   (ii) applying a positive voltage to the aluminum component.

29. A method according to claim 28 wherein the acidic solution comprises sulfuric acid, chromic acid, oxalic acid, phosphoric acid, water or mixtures thereof.

* * * * *